United States Patent [19]

Dinges

[11] 4,284,926

[45] Aug. 18, 1981

[54] DECORATIVE LIGHTING CONTROL WITH A WAVEFORM GENERATOR

[76] Inventor: Frank Dinges, 176 W. 87th St., New York, N.Y. 10024

[21] Appl. No.: 963,349

[22] Filed: Nov. 24, 1978

[51] Int. Cl.[3] ........................ H05B 37/02; H03K 7/08

[52] U.S. Cl. .................................... 315/312; 307/265; 315/210; 315/226; 315/297; 315/323; 332/9 R

[58] Field of Search ................... 315/209 R, 291, 294, 315/297, 312-314, 323, 161, 174, 201, 210, 226; 307/221 R, 222 R, 265, 3, 73; 332/9 R

[56] References Cited

U.S. PATENT DOCUMENTS 3,968,401 7/1976 Bryant ............................ 315/291 X

*Primary Examiner*—Eugene R. La Roche

*Attorney, Agent, or Firm*—Posnack, Roberts, Cohen & Spiecens

[57] ABSTRACT

Decorative lighting control is effected by a waveform generator which employs an up-down counter that is alternately stepped in up and down directions. Each time the counter reaches either the maximum or minimum count, it is loaded with a count value representing the width of a pulse to be generated and the direction of the count is changed. A source of the count value is provided by utilizing another up-down counter. The width modulated pulses which result are used to control lighting devices.

16 Claims, 3 Drawing Figures

CONTROLLED LIGHTING SYSTEM CLS

DECORATIVE LIGHTING CONTROL WITH A WAVEFORM GENERATOR

FIELD OF INVENTION

This invention pertains to the control of decorative or discotheque lighting and the like by waveform genertors and, more particularly, to pulse width modulation and digital-to-analog conversion.

BACKGROUND OF THE INVENTION

Pulse width modulators can be used to generator waveforms which have many functions such as the representation of information or the control of the operating time of devices.

One particular application of timing control is associated with discotheque lighting. One of the effects demanded of such lighting is the periodic gradual dimming or illuminating of the lighting devices. Generally, the dimming is controlled by an analog voltage which changes amplitude with the dimming rate. Presently available analog waveform generators have limited versatility and range. It has been found that controlled pulse width modulated waveforms cannot only more easily perform these functions, but they are more versatile and less expensive.

SUMMARY OF THE INVENTION

It is accordingly a general object of the invention to provide an improved waveform generator of width modulated pulses.

Another object of the invention is to provide for the control of discotheque lighting by the use of pulse width modulated waveforms.

Briefly, the invention contemplates an up-down counter means with a plurality of load input terminals for registering an initial count value represented by a received coded combination of signals. The counter means is unit incremented periodically by pulses fed to a count input while the direction of incrementing is controlled by a signal received at a direction input. In addition, the counter has two outputs, one indicating a lower desired count value and the other indicating a higher desired count value. These outputs are connected to the input of a binary means whose output changes state each time a signal is received at its input. The output of the binary means is not only connected to the direction input of the counter means but also transmits pulse signals whose width is determined by the initial count value represented by a received coded combination of signals.

Other aspects of the invention are concerned with means for generating the coded combination of signals representing the initial count values and with using the width modulated pulses to control the operation of controlled devices such as lights.

Other objects, features and advantages of the invention will be apparent from the following detailed description when read with the accompanying drawing which shows, by way of example, and not limitation, the presently preferred embodiment of the invention.

BRIEF DESCRIPTION OF THE DRAWINGS

IN THE DRAWING

Figure 1:
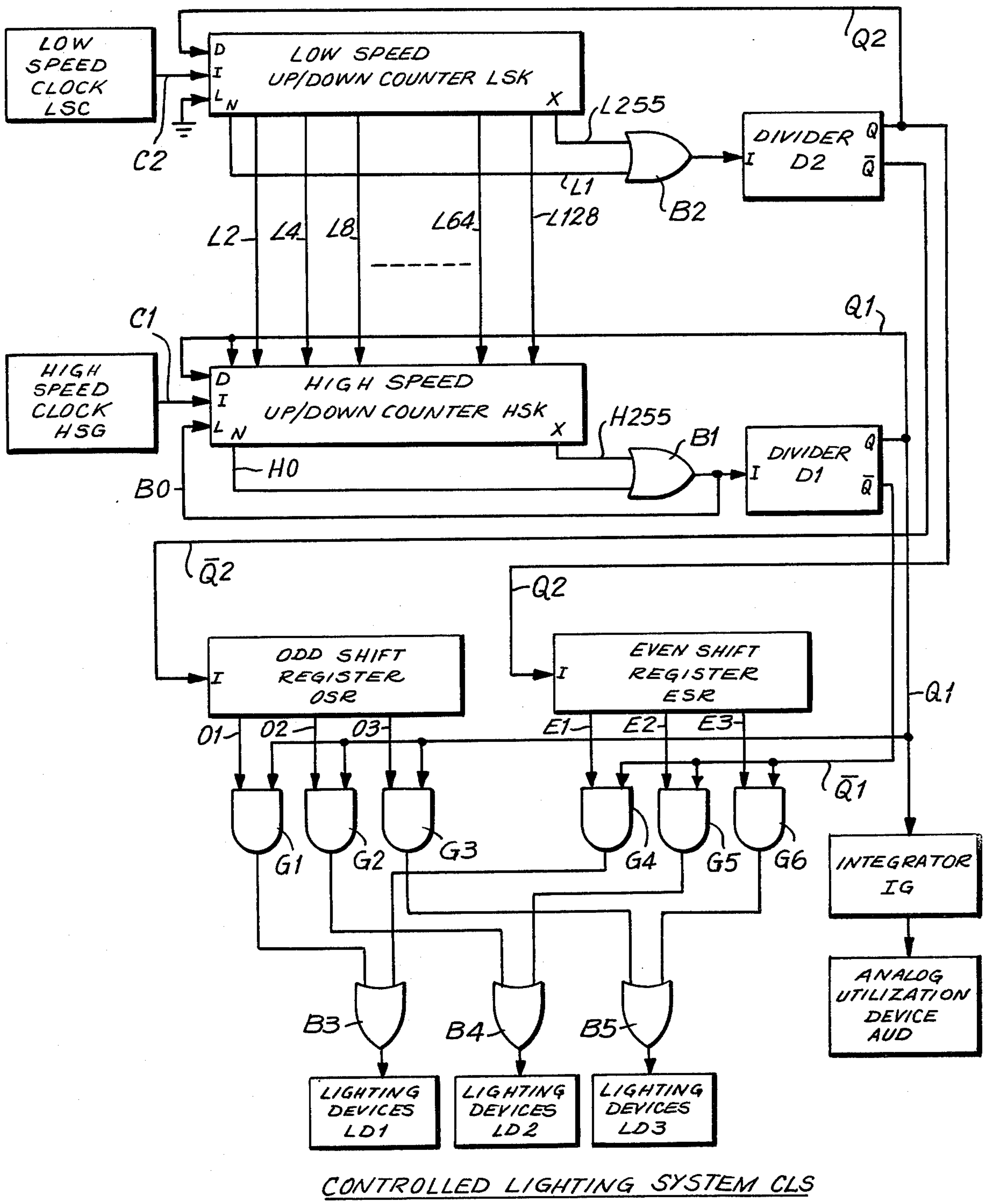
Figure 2:
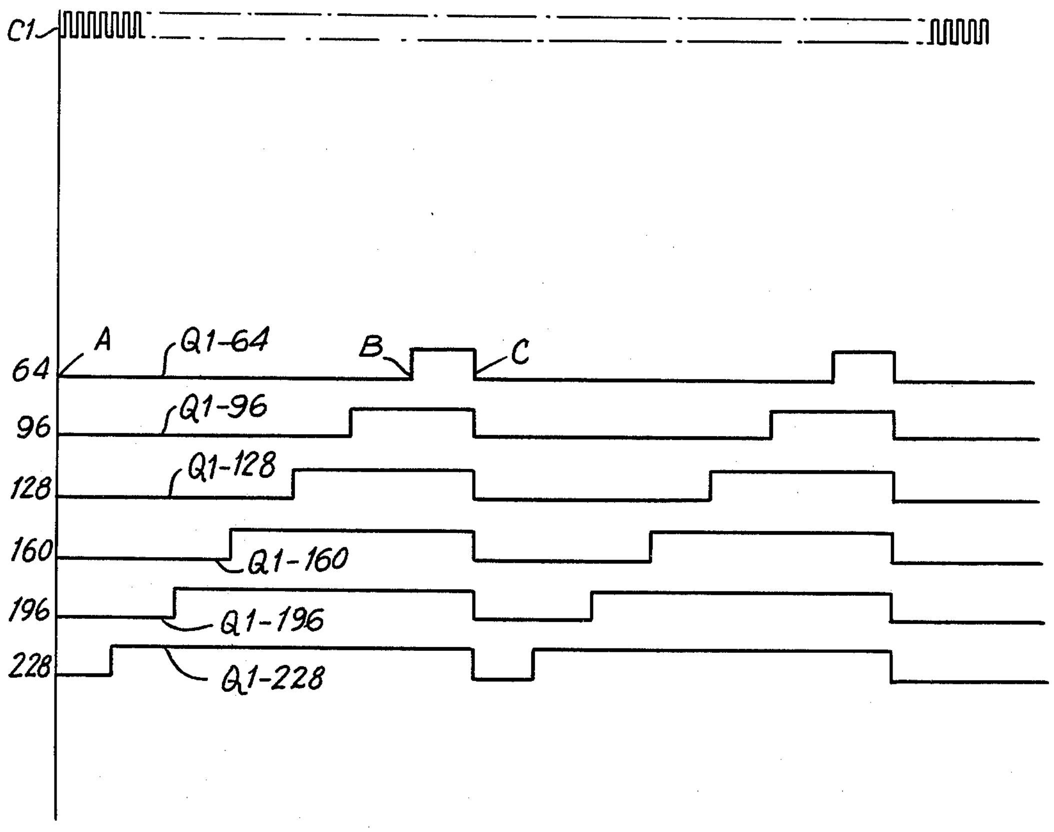
Figure 3:
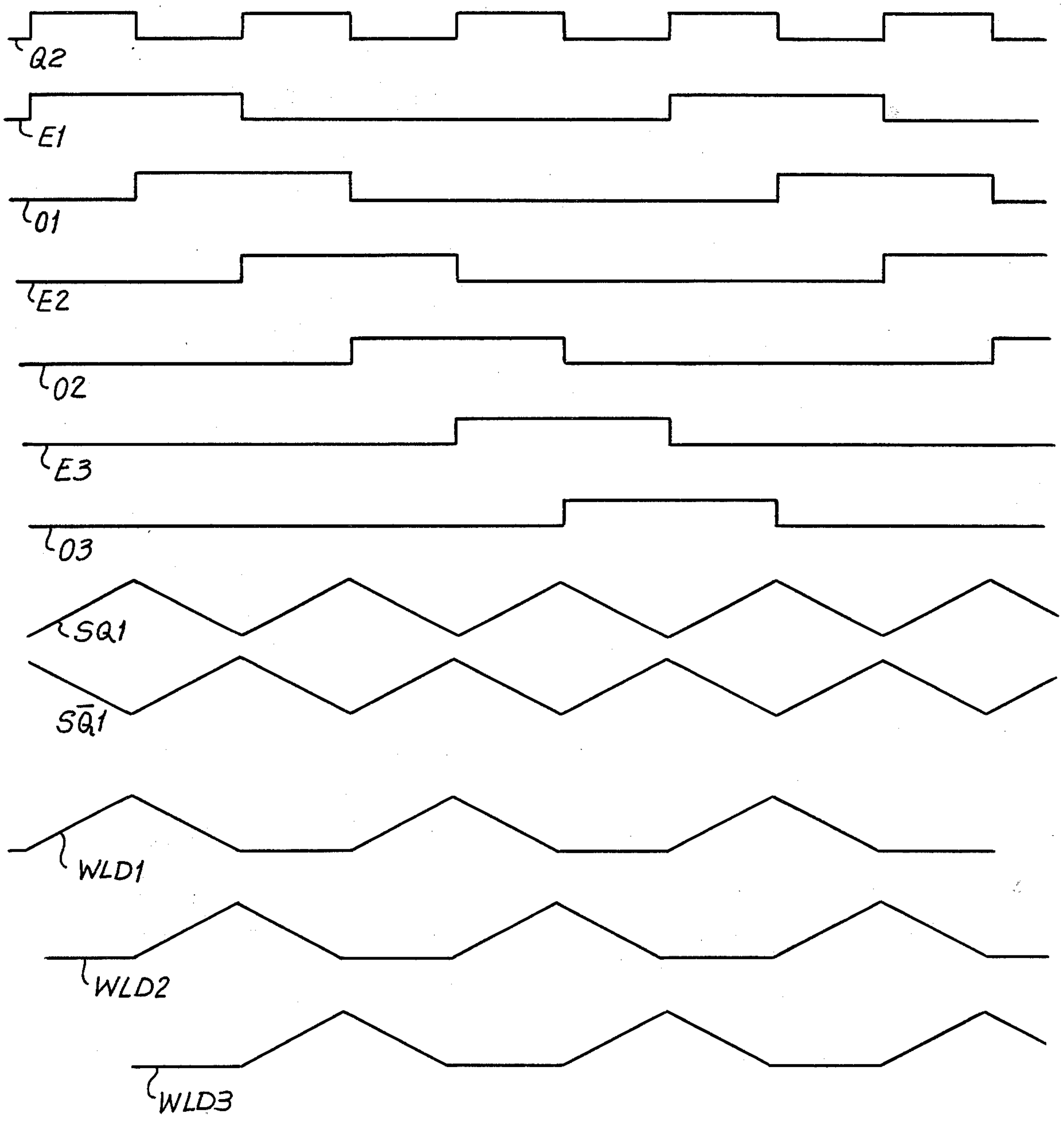

FIG. 1 is a block diagram of a controlled lighting system utilizing the invention; and FIGS. 2 and 3 are charts of waveforms helpful in explaining the operation of the system of FIG. 1.

DESCRIPTION OF THE PREFERRED EMBODIMENT

In FIG. 1, a controlled lighting system CLS is shown centered around: a low speed up-down counter LSK driven by low speed clock LSC; a high speed up-down counter HSK driven by high speed clock HSC; shift registers OSR and ESR driven by divider D2 in response to counts in counter LSK; and lighting devices LD1 to LD3 controlled by AND-circuits G1 to G6 in response to signals from the shift registers OSR and ESR and divider D1 in response to counts in counter HSK.

The heart of the system is a pulse width modulator which receives a binary coded combination of signals representing a binary count and converts this combination to a pulse having a width proportional to the count. Such a pulse width modulator according to the invention includes up-down counter HSK which, by way of example, is an eight stage up-down counter which can count between zero and 255. Each of the more significant stages is connected to one of the lines L2 to L128 upon which are delivered binary coded combination of signals representing any number between 2 and 254. The number represented by the signals on lines L2 to L128 is loaded into the counter upon occurrence of a signal at its load input from line BO. The counter HSK has a unit changing input I connected to high speed clock HSC so that, upon receipt of clock pulse, the accumulated count is changed by one. The direction of change is determined by the level of the signal at direction input D. Whenever the count in the counter reaches a lower predetermined value, say zero, its output N delivers a pulse on line HO to OR-circuit B1. Whenever counter HSK accumulates an upper count, say 255, its X output delivers a pulse via line H255 to OR-circuit B1. Whenever OR-circuit B1 is pulsed, it delivers a pulse on line BO and also to the I input of divider D1. Divider D1 is a bistable device which, in response to pulses received at input I, changes state, i.e., the signal on output Q assumes the level of the signal on output Q, and the signal on output Q assumes the level of the output Q.

The modulator operates in the following manner assuming that the signal on line Q1 is high and the counter HSK is counting down. When the count reaches zero, the pulse on line HO causes the levels at the outputs of divider D1 to change. Thus, the level of the signal on line Q1 drops as does the D input of the counter which, in response thereto, operates as an up counter. In addition, the pulse on line BO connected to load input L triggers the stages of the counter to accept the coded combination of signals on lines L2 to L128. Let it be assumed the combination represents the number 64. The situation is such that the signal on line Q1 is low. The counter holds a count of 64 and counts upwardly. This is represented at point A of FIG. 2. The counter counts the clock pulses on line C1 (see also FIG. 2, line C1). When the count reaches 255 (point B) a pulse on line H255 passes via OR-circuit B1 and changes the state of the divider D1 and passes via line BO and pulses the input L. The signal on line Q1 goes high, the counter is set to down count, and the count of 64 on lines L2 to L128 is again loaded into the counter LSK. The counter starts counting down from 64. When the count reaches zero (see point C), the pulse on line HO passes via the OR-circuit B1, and toggles the divider D1 and passes via line BO and triggers the load input L. The cycle then repeats. The width modulated pulse for binary value of 64 is shown as waveform Q1-64 of FIG. 2. For the loading values of 96, 128, 160, 196 and 228 waveforms Q1-96, Q1-128, Q1-160, Q1-196 and Q1-228 are shown in FIG. 2. These values are representative. In fact, any vaue between one and 254 will produce a corresponding waveform. The values zero and 255 are forbidden because they produce end traps. Should the number zero be entered, when the counter is commanded to down count, the next number would be 255 because zero equals 256. At this count of 255, the counter is again told to change direction. The same type of problem exists when loading a count of 255. Thus, in either case, the counter becomes either trapped or loses pulse width modulation completely. To prevent this possibility, the input to the least significant stage of the counter is connected to line Q1. Therefore, when counting down, i.e., line Q1 high, a one is always loaded into the least significant stage so that the lowest value that can be loaded is one. When counting up, i.e., when line Q1 is low, only a zero can be loaded into this least significant stage so that the maximum number that can be loaded is 254.

In order to remove any directional ambiquity, one can replace divider D1 by a set-reset filp-flop having its set input connected to line HO and its reset input connected to line H255.

The line Q1 can be connected to a current type integrator IG whose output is connected to an analog utilization device AVD whereby binary coded words represented by signals on lines L2 to L128 are converted to an analog signal.

In the present system, the source of the binary coded words is the complex of low speed counter LSK, low speed clock LSC, OR-circuit B2 and divider D2. This complex is the same as for the modulator with the following exceptions. The pulse rate of clock LSC is very much less than that of clock HSC; and there is no loading of the counter. The counter merely runs from zero to 255, and back to zero and repeats this cycle.

In this way, smoothly and monotonically changing pulse widths are generated by divider D1. These smoothly changing widths are shown in FIG. 3 by means of symbolic waveforms SQ1 and SQ1 associated with lines Q1 and Q1 respectively of FIG. 1. These width modulated pulses are used to control sets of lights.

In particular, by way of example, two sets of three light groups will be controlled in such a way that, in each set, one light group will be smoothly increased in illumination, as the second light group will be smoothly decreasing in illumination, while the third is extinguished. These states of lighting periodically sweep through the groups.

Accordingly, line Q2 connected to the Q output of divider D2 steps a three-stage even shift register ESR and line Q2 steps a three-stage odd shift register OSR. Waveform Q2 of FIG. 3 is the representation of the signal on line Q2; the signal on line Q2 has the inverse of this waveform. The outputs of the stages of odd shift register OSR are fed via respective lines O1, O2 and O3 to inputs of two-input AND-circuits G1, G2 and G3, respectively, whose other input is connected to line Q1. Similarly, the outputs of the stages of even shift register ESR are fed via lines E1, E2 and E3 to respective inputs of two-input AND circuits G4, G5 and G6, whose other input is connected to line Q1.

The outputs of AND-circuits G1 and G4 are connected to OR-circuit B3 which controls lighting devices LD1. Waveform WLD1 shows either the control signal or illumination amplitude for the lighting devices LD1. Similarly, the outputs of AND-circuits G2 and G5 are connected to OR-circuit B3 which controls lighting devices LD2. Waveform WLD2 of FIG. 2 performs the same function for devices LD2 as waveform WLD1 does for devices LD1. Likewise, the ouputs of AND-circuits G3 and G6 are fed to OR-circuit B5 for controlling lighting devices LD3. Waveform WLD3 represents the amplitude of the illumination of lighting device LD3.

While the preferred embodiment of the invention has been shown and described in detail, there will now be obvious to those skilled in the art many modifications satisfying many or all of the objects of the invention without departing from the spirit thereof as defined by the appended claims.

What is claimed is:

1. A waveform generator comprising: a multi-stage up-down counter means, said up-down counter means having a plurality of load input terminals connected to the stages for registering a desired initial count in response to a coded combination of signals received in parallel, a count input for unit changing the registered count in response to a received pulse, a direction input for controlling the direction of the counting in response to the level of a received signal, an upper output for emitting a signal whenever the registered count reaches a given upper value, and a lower output for emitting a signal whenever the registered count reaches a given lower value; loading means for controllably feeding a coded parallel combination of signals representing a desired initial count to said load input terminals; a pulse source connected to said count input and operating at a given frequency; and binary means for emitting a signal having a first level when in a first state and emitting a signal having a second level when in a second state, said binary means having an input for changing the state of the binary means upon receipt of a signal from one of said outputs and being connected to said upper output and said lower output, and said binary means having an output for controlling said loading means and for emitting a width modulated waveform signal.

2. The waveform generator of claim 1 further comprising lighting means connected to the output of said binary means.

3. The waveform generator of claim 1 further comprising means for preventing the loading of the given upper value when said up-down counter means is counting upwardly and for preventing the loading of the given lower value when said up-down counter means in counting downwardly.

4. The waveform generator of claim 1 wherein said loading means comprises: another multi-stage up-down counter means, said other up-down counter mens having a plurality of output terminals connected to said load input terminals, another count input for unit changing a registered count in response to each received pulse, another direction input for controlling the direction of the counting in response to the level of a received signal, another upper output for emitting a signal whenever the registered count reaches a predetermined upper value, and another lower output for emitting a signal when the registered count reaches a predetermined lower value; another free running pulse source connected to said other count input and operating at a lower pulse frequency than said given pulse frequency, and another binary means for emitting a signal having a first level when in a first state and emitting a signal having a second level when in a second state, said other binary means having an input for changing the state thereof upon receipt of a signal from the latter said upper and lower outputs and being connected to the latter said other upper output and said other lower output, and said other binary means having an output connected to said other direction input.

5. The waveform generator of claim 4 further comprising means for preventing the loading of the given upper value when said up-down counter means is counting upwardly and for preventing the loading of the given lower value when said up-down counter means in counting downwardly.

6. The waveform generator of claim 4 further comprising multi-stage register means having an input connected to the output of said other binary means and having an output at each stage, a plurality of coincidence means each having an output, a first input connected to the output of said binary means and another input connected to a different one of the outputs of said shift register means.

7. The waveform generator of claim 6 wherein: said binary means has a direct and an inverting output; said other binary means has a direct and inverting output; said multistage shift register means comprises a first multistage shift register having an input connected to the direct input of said binary means and a plurality of outputs and a second multistage shift register having an input connected to the inverting output of said binary means and a plurality of outputs; and said coincidence means comprises a first plurality of two-input AND-circuits the first input of each AND-circuit being connected to the direct input of said other binary means, and the second input of each AND-circuit being connected to different output of said first multistage shift register, and a second plurality of two-input AND-circuits, the first input of each AND-circuit of said second plurality being connected to the inverting input of said other binary means and the second input of each of said AND-circuits being connected to a different output of said second multistage shift register.

8. The waveform generator of claim 6 or 7 further comprising lighting means connected to the outputs of said coincidence means.

9. A decorative lighting control comprising a discotheque lighting means, a multi-stage up-down counter means, said up-down counter means having a plurality of load input terminals connected to the stages for registering a desired initial count in response to a coded combination of signals received in parallel, a count input for unit changing the registered count in response to a received pulse, a direction input for controlling the direction of the counting in response to the level of a received signal, an upper output for emitting a signal whenever the registered count reaches a given upper value, and a lower output for emitting a signal whenever the registered count reaches a given lower value; loading means for controllably feeding a coded parallel combination of signals representing a desired initial count to said load input terminals; a pulse source connected to said count input and operating at a given frequency; and binary means for emitting a signal having a first level when in a first state and emitting a signal having a second level when in a second state, sais binary means having an input for changing the state of the binary means upon receipt of a signal from one of said outputs and being connected to said upper output and said lower output, and said binary means having an output for controlling said loading means and for emitting a width modulated waveform signal, said lighting means being coupled to the output of said binary means.

10. The lighting control of claim 9 further comprising means for preventing the loading of the given upper value when said up-down counter means is counting upwardly and for preventing the loading of the given lower value when said up-down counter means in counting downwardly.

11. The lighting control of claim 9 wherein said loading means comprises; another multi-stage up-down counter means said other up-down counter means having a plurality of output terminals connected to said load input terminals, another count input for unit changing a registered count in response to a received pulse, another direction input for controlling the direction of the counting in response to the level of a received signal, another upper output for emitting a signal whenever the registered count reaches a predetermined upper value, and another lower output for emitting a signal when the registered count reaches a predetermined lower value; another free running pulse source connected to said other count input and operating at a lower pulse frequency than said given pulse frequency, and another binary means for emitting a signal having a first level when in a first state and emitting a signal having a second level when in a second state, said other binary means having an input for changing the state thereof upon receipt of a signal from the latter said upper and lower outputs and being connected to said other upper output and said other lower output, and said other binary means having an output connected to said other direction input.

12. The lighting control of claim 11 further comprising means for preventing the loading of the given upper value when said up-down counter means is counting upwardly and for preventing the loading of the given lower value when said up-down counter means in counting downwardly.

13. The lighting control of claim 11 further comprising multi-stage shift register means having an input connected to the output of said other binary means and having an output at each stage, a plurality of coincidence means each having an output, a first input connected to the output of said binary means and another input connected to a different one of the outputs of said shift register means.

14. The lighting control of claim 13 wherein: said binary means has a direct and an inverting output; said multistage shift register means comprises a first multistage shift register having an input connected to the direct input of said binary means and a plurality of outputs and a second multistage shift register having an input connected to the inverting output of said binary means and a plurality of outputs; and said coincidence means comprises a first plurality of two-input AND-circuits the first input of each AND-circuit being connected to the direct input of said other binary means, and the second input of each AND-circuit being connected to different output of said first multistage shift register, and a second plurality of two-input AND-circuits, the first input of each AND-circuit of said second plurality being connected to the inverting input of said other binary means and the second input of each of said AND-circuits being connected to a different output of said second multistage shift register.

15. The lighting control of claim 14 further comprising lighting means connected to the outputs of said coincidence means.

16. The lighting control of claim 13 further comprising lighting means connected to the outputs of said coincidence means.

* * * * *